United States Patent [19]

Kalbskopf et al.

[11] 4,325,987
[45] Apr. 20, 1982

[54] PROCESS FOR THE PRODUCTION OF AN ELECTRICALLY CONDUCTING ARTICLE

[75] Inventors: Reinhard Kalbskopf, Onex; Otto Baumberger, Carouge, both of Switzerland

[73] Assignee: Societa Italiana Vetro-Siv-S.p.A., San Salvo, Italy

[21] Appl. No.: 223,263

[22] Filed: Jan. 8, 1981

Related U.S. Application Data

[62] Division of Ser. No. 173,806, Jul. 30, 1980.

[30] Foreign Application Priority Data

Jul. 31, 1979 [CH] Switzerland .................. 7033/79

[51] Int. Cl.³ .................................. C03C 17/245
[52] U.S. Cl. ............................ 427/110; 65/60.52; 427/126.2; 427/126.3; 427/160
[58] Field of Search .......... 427/109, 126.2, 126.3, 427/160; 65/60.52

[56] References Cited

FOREIGN PATENT DOCUMENTS 1207231  2/1960  France.

Primary Examiner—James R. Hoffman
Attorney, Agent, or Firm—Finnegan, Henderson, Farabow, Garrett & Dunner

[57] ABSTRACT

Substrate of glass or other mineral material covered with a coating of $SnO_2$ whose electrical conductivity, transparency in the visible spectrum and thermal reflectivity are very high.

This coating is obtained by the technique of vapor phase chemical deposition (CVD), by reacting a volatile tin compound with water vapor in the presence of hydrogen, on the heated substrate surface. The reaction mixture may also inclue HF.

The coated substrate is suitable for electrically heated glazing.

8 Claims, 2 Drawing Figures

PROCESS FOR THE PRODUCTION OF AN ELECTRICALLY CONDUCTING ARTICLE

This is a division of application Ser. No. 06/173,806, filed July 30, 1980.

The present invention relates to a process for producing an electrically conducting article consisting of a substrate of glass or other mineral material covered with a conducting layer of tin oxide, in which process a compound of tin and water vapour diluted in a carrier gas are caused to react on the surface of the said substrate, and to such a conducting article.

The substrate is preferably a plate or sheet of silica glass, boro-silicate glass or soda-calcium glass, and the article is preferably an electrically conducting sheet of glass suitable for a large number of industrial applications as will be seen hereinafter. Particularly suitable are sheets of glass 1 to 15 mm thick, especially "float" glass 2 to 7.4 mm thick.

However, the substrate may also consist of other, transparent or opaque, mineral materials, such as for example porcelain, pottery, earthenware, cermets and enamels.

The article of the invention is characterised by the fact that for coating thicknesses of 1 to 3 µm, the article has the following properties: surface resistance $R_\square = 1\text{-}10\,\Omega$, preferably about $2\text{-}5\,\Omega$, transparency $\geq 70\%$, I.R. reflectivity $\geq 50\%$. Preferably the said coating does not undergo any substantial change when the article is subjected to hot bending and tempering. For tempering, the substrate is heated to about 700° C. and is then cooled at a rate of 5° to 10° C./second. For bending, the article is heated to the softening point and is then bent, preferably from the side where the coating is subjected to compression. During this operation, radii of curvature of the order of 15 cm may be achieved without damaging the conducting coating. The resistivity of the $SnO_2$ layer of the present article is of the order of at least $10^{-2}\,\Omega.\text{cm}$.

The use of stannic oxide to render a glass or ceramics substrate conducting is known and is the subject of various publications, among which may be mentioned: "Physical Properties of $SnO_2$ Materials" by Z. M. JARZEBSKI and J. P. MARTON, J. Electrochem. Soc. 1976, 199; 299c; 333c. "Chemical Vapor Deposition of Antimony-Doped Tin Oxide Films Formed from Dibutyl Tin Diacetate", by J. KANE, H. P. SCHWEIZER, W. KERN, J. Electrochem. Soc. 1976, 123, No. 2, 270; "Composition and Conductivity of Tin Oxide Films Prepared by Pyrohydrolytic Decomposition of Tin(IV) Compounds", by H. KIM and H. A. LAITINEN, J. Amer. Ceramic Soc. 58, 23 (1975); Belgian Patent Specification No. 869,062. This patent specification describes a glass plate covered with a coating whose resistance ($R_\square$) is less than $50\,\Omega$ and which has a high IR reflectivity. The patent does not however give any precise details of how to produce such a glass plate, and the disclosures accordingly do not contribute anything to the advancement of the state of the art. Thus, up to the present time it has not been possible to produce a conducting glass plate or window having the electrical and optical properties of the article of the invention, and which is moreover able to withstand, without undergoing any changes, the simultaneous tempering, treatment and finishing operations required in the production of glass plates and windows for the construction and automotive industries. In fact, the known stannic oxide coatings are deficient either as regards conductivity or transparency, or are too fragile to withstand the mechanical and thermal contraints produced by the tempering and shaping operations on the glass panels to which they are applied. These defects have now been overcome by means of the process of the invention, which involves the so-called CVD (chemical vapour deposition) technique and which consists of reacting a volatile tin compound with water vapour and a reducing agent on the surface of the heated substrate.

At the present time several various processes and apparatus are available for covering a substrate, for example a glass plate, with a conducting layer of stannic oxide having a transparency fairly close to that of the substrate and also a relatively low electrical resistivity and a high mechanical strength.

Thus, among other processes, particular use has been made of the vapour phase deposition technique (CVD). A process and an apparatus for depositing a thin layer of $SnO_2$ on a small glass plate by reacting $SnCl_4$ and $H_2O$ brought together in dilute form in a carrier gas, in the present case air, and into mutual contact with the surface of the small glass plate previously heated to a temperature of the order of 200° to 400° C., are known in particular from the article by H. Koch "Elektrische Untersuchungen an Zinndioxydschichten" (see Phys. Stat. 1963, Vol. 3, pages 1059 and 55). The two gaseous reactants are projected onto the glass by means of a nozzle having two coaxial jets, the centre jet receiving the dilute gaseous $SnO_2$ while the external jet is supplied with dilute gaseous $H_2O$.

A process and apparatus very similar to that described above has also been proposed, in particular in German Patent Application No. 21 33 274, published before examination, which moreover enables the $SnO_2$ layer deposited on a substrate, in this case also a small glass plate, to be doped with antimony in order to reduce the electrical resistivity of this layer. To this end, $SbCl_3$ or $SbCl_5$ have in particular also been employed in dilute form in a carrier gas, in this case nitrogen, which is brought in the presence of $SnCl_4$ and $H_2O$ to the region above the substrate by means of a nozzle with three coaxial jets, each receiving one of the above components. The combination reaction is thus carried out in the vicinity of the substrate and at a specific distance from the three jets of the nozzle. U.S. Pat. Nos. 3,850,679 and 3,888,649 and British Patent Specification No. 1,507,996 may also be mentioned.

In addition, it is known that the addition of a reducing agent to the formation reaction of stannic oxide from a tin compound and water vapour improves the conductivity of the resulting layer. Thus, KUZNETSOV (Fizika Tverdogo Tela, Vol. 2, No. 1, 35–42 (1960) describes the hydrolysis of $SnCl_4$ dissolved in alcohol by spraying water and such a solution onto a surface heated to 500° C., the conductivity of the layer thus obtained (3 µm) being $10^{-2}\,\Omega^{-1}$, i.e. a resistivity $\rho$ of the order of $10^2\,\Omega.\text{cm}$. The transparency of a coating obtained under such conditions is however not satisfactory.

The reasons why a reducing agent, which presumably converts part of the tetravalent tin into divalent tin and improves the conductivity, are added are not very clear since it seems rather unlikely that metallic tin, whose presence could easily be detected since it results in an opacification of the transparent layer, would be formed in such a case. On the other hand, it is not impossible that $SnO_2$ can form, with the SnO resulting from the reduction, an electron deficient excited molecule (for example $[Sn_2^{IV}O_3]^{++}$) whose presence would improve the conductivity by hole transfer (hole conductivity).

Be that as it may, it has been found that when, as mentioned above, the CVD technique is used for the reaction between $SnCl_4$ and $H_2O$, the addition of alcohol as a reducing agent in the form of a simple mixture with $SnCl_4$ does not provide conducting layers having very substantially improved properties, which indicates that pre-mixing of the reactants is not sufficient.

According to the process of the invention, the procedure involves the use of a carrier gas containing at least 30% by volume of hydrogen, which produces a partial reduction of the $SnO_2$ or of the reactants during their reaction on the substrate.

It should be noted at this stage that the use of hydrogen during operations for depositing $SnO_2$ by CVD is not unknown per se. In actual fact, the Journal of the Electrochemical Society 120 (5), 701-2 (1973) describes the deposition by CVD of $SnO_2$ layers on a silicon oxide substrate. The reactants are $SnCl_4$ and water vapour, and the carrier gas is nitrogen. This article states that the reaction was carried out in the secondary presence of oxygen or hydrogen. It is however not possible to determine the relative amount of hydrogen used from the description of the experimental conditions given in this reference; it is probable that the relative amount would be small since the reference does not state that the presence of hydrogen results in any increase in conductivity of the $SnO_2$ layer. Moreover, French Pat. No. 1,207,231 (PHILIPS) describes a process for depositing metal oxide layers, in particular of $SnO_2$, on a substrate using CVD, in which $SnCl_4$, water vapour and, optionally, hydrogen are used, the hydrogen being intended to form the water necessary for hydrolysing stannic tetrachloride by reaction with oxygen (for example in the air). The examples in this patent indicate however that the percentage of hydrogen in the gaseous mixture used is relatively small (about 7.5%) and is clearly less than that of the mixtures according to the present invention, where a minimum of 30% by volume of hydrogen in the gas mixture is necessary to ensure an $SnO_2$ coating having a sufficiently low resistivity.

Apparatus known in the art for coating mineral substrates with stannic oxide by vapour phase deposition techniques (CVD) may be used for implementing the process of the invention. As mentioned in the introduction, such apparatus involves feeding jets of gas containing the reactants ($SnCl_4$+carrier gas and $H_2O$+carrier gas) simultaneously onto the substrate heated to a suitable temperature (400°-600° C.). The process of the invention adopts the same procedure, using as carrier gas a mixture of hydrogen and an inert gas, for example nitrogen. This mixture preferably contains 30 to 80% by volume or more of hydrogen. However, in certain special cases the hydrogen may be used practically pure, for example in a concentration of 99.9%.

Pure $SnCl_4$ or $SnCl_4$ dissolved in an inert solvent is preferably employed as the tin compound, but other volatile tin compounds, for example of the type $Sn(Alk)_4$ where Alk denotes a lower alkyl radical, and dibutyl-diacetyl tin, may be used.

THe CVC coating apparatus described by the Applicants in their Swiss Patent Application No. 1412/79-6 is preferably used for implementing the present process. In fact, as will be seen hereinafter, such an apparatus enables glass sheets or plates to be efficiently coated at very high rates with an extremely homogeneous layer of $SnO_2$, thereby imparting outstanding characteristics to the product of the invention as regards mechanical behaviour, and electrical and optical properties of all kinds.

The accompanying drawing illustrates by way of example and very diagrammatically one embodiment of the apparatus forming the object of the present invention:

Figure 1:
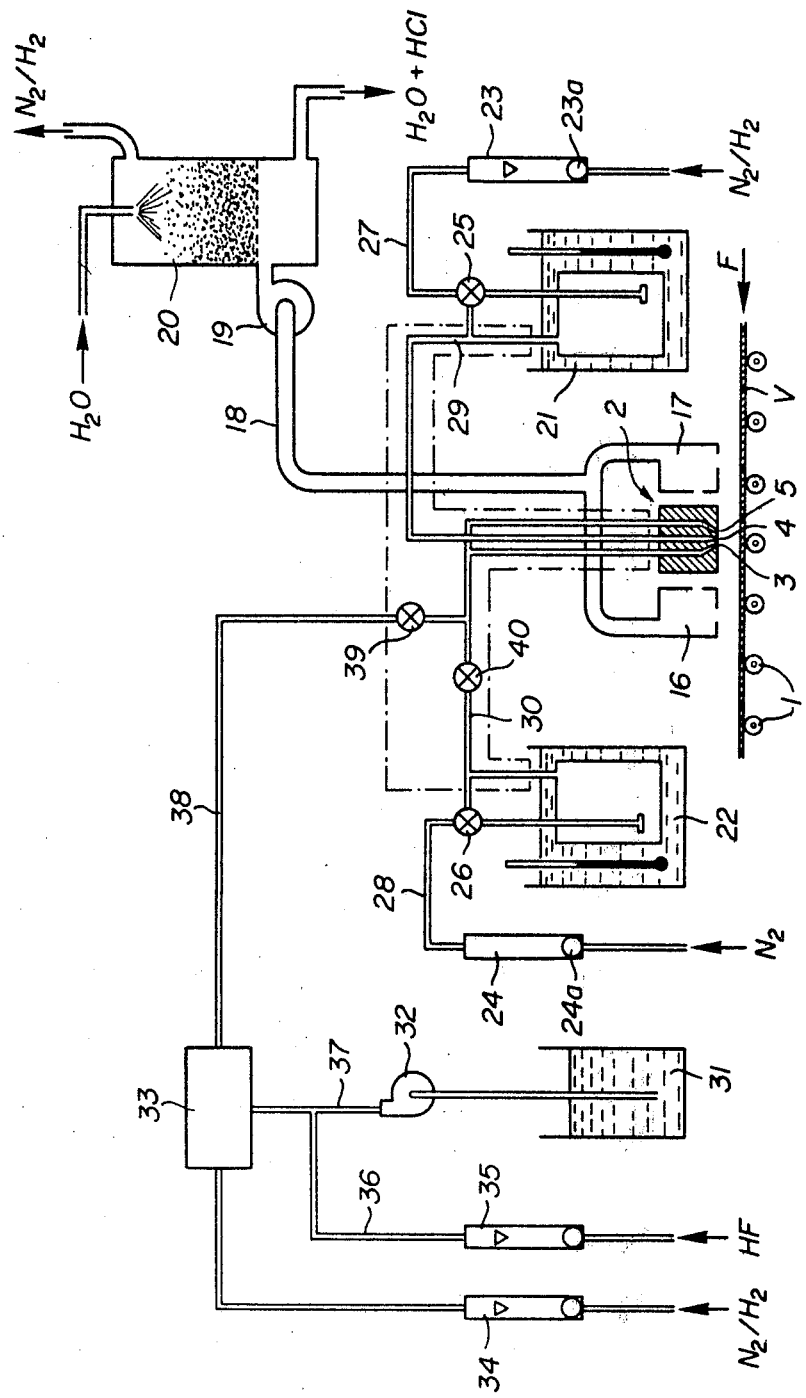
FIG. 1 is an overall view.

The apparatus illustrated in the drawing is intended for depositing a layer of stannic oxide $SnO_2$ on a substrate, in the present case a sheet of glass V heated to a high temperature, by the so-called CVD technique, employing the following chemical reaction:

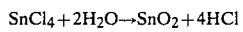

$$SnCl_4 + 2H_2O \rightarrow SnO_2 + 4HCl$$

To this end, this apparatus comprises first of all a set of rollers 1 on which the sheet V is placed and moves in the direction F, the rollers being rotatably driven in an anti-clockwise direction by an electric motor (not shown) and having, of course, a length compatible with the width of the glass sheet being supported. The rotational velocity of the rollers 1 with be chosen so that the displacement of the sheet V takes place at a linear velocity of a few meters per minute, of the order of 1 to 15 meters per minute depending on the particular case. It is understood of course that this velocity range is given here only as an indication. If necessary, much higher displacement speeds of the glass may be employed.

Figure 2:
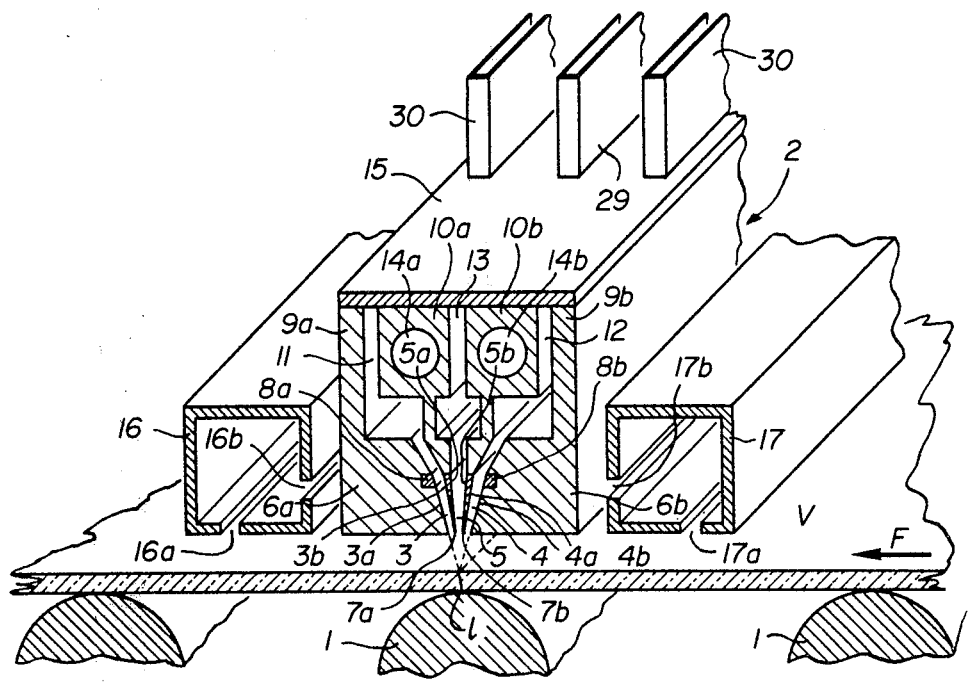
FIG. 2 is a partial perspective view of a vertical section, on an enlarged scale, of an element of the apparatus of FIG. 1.

Above this set of rollers 1, the illustrated apparatus comprises a nozzle 2 whose basic structural profile is the subject of FIG. 2, to which reference will be made henceforth. This nozzle comprises in fact three separate jets 3, 4 and 5, extending longitudinally in the direction parallel to the afore-mentioned rollers 1, over a length corresponding to the width of the glass sheet V. Such jets may thus have a length of several meters. As can be seen from the drawing, the jets 3 to 5 are formed by joining elongated profiled sections 6a and 6b, 7a and 7b, 8a and 8b, themselves fixed by any suitable means, to two pairs of profiled sections 9a and 9b, and 10a and 10b respectively, defining between themselves passages 11, 12 and 13 communicating with the jets 3, 4 and 5 respectively.

The side walls 3a and 3b, 4a and 4b, 5a and 5b of the jets 3 to 5 converge to a common line L distant from the plane containing the lower face of the profiled sections 6a and 6b by a length of the order of 3 to 6 mm for example. In addition, the outlet openings of the jets 3, 4 and 5, which are in the form of three oblong slits extending over the whole length of the profiled sections 6a, 7a, 7b and 6b, have a width of a few tenths of a millimeter, for example about 1/10 to 5/10.

The width of the lower face of the profiled sections 6a and 6b will preferably be between 10 and 20 times the overall width of the outlet slits of the jets 3 to 5.

Preferably, but not necessarily, this lower face of the profiled sections 6a and 6b will be covered with a layer of a chemically inert metal or an alloy of such metals, or even metal oxides. By way of example, this metal may be gold or platinum. The oxides may be selected from $SnO_2$, $SiO_2$ or $Al_2O_3$. Of course, if it were not for reasons of cost price, these parts could be made of solid inert metal. More usual metals and alloys, such as steel or brass exhibit in the presence of hydrogen catalytic properties capable of interfering in the control of the desired reaction for obtaining an SnO₂ deposit having the desired mechanical, physical and optical qualities.

Of course, the assembly of profiled sections constituting the nozzle 2 is covered at each end by a closure plate, not shown, mounted so as to ensure a total degree of tightness and to form thereby jets 3, 4 and 5 and passages 11, 12 and 13 which are firmly closed laterally. Channels 14a and 14b provided in the upper part of the profiled sections 10a and 10b over the whole length thereof permit the circulation of a fluid, for example oil, intended to maintain the nozzle 2 at an optimum operating temperature.

Another plate 15 covers the upper face of the nozzle 2 over its whole expanse and in a liquid- and gas-tight manner, thus preventing any communication between the passages 11, 12 and 13.

It will also be noted that the general profile and the surface state of the walls defining both the jets 3 to 5, passages 11 to 13 (FIG. 2) as well as the transverse sections of the latter are such that, for gas flow rates of the order of 3 to 6 liters/hour per centimeter of length of the nozzle, the flows from the outlet of the nozzles are "laminar".

On both sides of the nozzle 2 and over the whole length thereof the apparatus illustrated comprises two suction ducts 16 and 17 (FIGS. 1 and 2) of square cross-section, whose lower face is coplanar with the lower face of the profiled sections 6a and 6b previously described. These ducts each have two longitudinal slits, 16a and 16b in the case of the duct 16, and 17a and 17b in the case of the duct 17. These ducts are joined by a system of conduits 18 to the inlet of a suction pump 19 connected at its outlet to the base of a wash tower 20 filled with refractory material (Raschig rings).

The apparatus illustrated also comprises two thermostatically controlled mixing vessels 21 and 22, the first containing liquid stannic chloride SnCl₄ and the second containing methanol, two flow meters 23 and 24 having flow rate regulation valves 23a and 24a and fed with a mixture of nitrogen and hydrogen in a proportion varying from 20/80 to 80/20, and two valves 25 and 26 arranged on pipes 27 and 28 connecting the flow meters to the above mixing vessels. Two conduits 29 and 30 connect the outlet of the vessels 21 and 22 respectively to the passage 13 and to the passages 11 and 12 of the nozzle 2, i.e. in short to the jet 5 of this nozzle in the case of the conduit 29, and to the jets 3 and 4 in the case of the conduit 30.

The conduits 29 and 30 pass through an enclosure $E_1$, illustrated diagrammatically by the outline shown in chain-dotted lines, containing a heating liquid, for example oil, maintained at a constant temperature of about 110° C. by any suitable means.

The apparatus moreover comprises a vessel 31 containing water, which latter is pumped at an accurately measurable flow rate by a metering pump 32 and injected into an evaporator 33 heated to a temperature above 100° C.

The evaporator 33 is also supplied with a N₂/H₂ mixture in a proportion of 20:80 to 80:20 by means of a rotameter 34, and with hydrogen fluoride by means of a rotameter 35 whose outlet pipe 36 terminates at a point 37 located between the pump 32 and the evaporator 33. The apparatus in addition comprises a line 38 for feeding the mixture of water vapour and HF (about 98:2 to 99:1), and valves 39 and 40 enabling the respective flow rates of the H₂O/HF mixture and methanol to be regulated, or even one of them to be excluded completely.

The apparatus that has just been described enables a glass plate to be coated for example with a layer of stannic oxide of the order of 0.5 to 3 μm thick having, at one and the same time, a very good transparency, a relatively reduced electrical resistivity, an outstanding adherence to glass, and a high mechanical strength and high degree of resistance to acids.

An experimental apparatus of this type provided with a 50 cm long nozzle in which the opening of the jets 3, 4 and 5 was 0.1, 0.1 and 0.2 mm wide, was used to treat a glass plate 50 cm wide and 4 mm thick heated to about 600° C. and driven in the direction F (FIGS. 1 and 2) at a velocity of 2 meters/minute. The distance between the lower face of the nozzle and the surface of the glass was 4 mm.

The vessels used had a capacity of about one liter of SnCl₄ in the case of the vessel 21 and one liter of H₂O in the case of the vessel 31. The vessel 21 was heated at a suitable temperature so that, with a flow rate of carrier gas N₂/H₂ of 60 liters/hour for the vessel 21 and of 120 liters/hour for the evaporator 33, and with an output of the pump 32 of 1 mole of H₂O per hour, a flow rate of 2 moles/hour of stannic chloride is obtained. In addition, the temperature of the nozzle was maintained at a value of about 110° C. by circulating oil through the channels 14a and 14b in the nozzle (FIG. 2).

Bearing in mind the profile of the jets 3, 4 and 5 of the nozzle 2, and in particular the fact that their side walls converge towards a common line L, the gas flows leaving these discharge pipes—flow of SnCl₄ in the case of the jet 5 and of water vapour in the case of the jets 3 and 4—are laminar and come into mutual contact, first of all in the form of a tangential grazing contact and then increasingly more directly as they approach the line L above. Of course, the combined flow of these three gaseous streams becomes less laminar as the streams interpenetrate. However, true interpenetration takes place only in the immediate vicinity of the surface of the glass V, which is heated to about 600° C. as described, with the result that the combination reaction:

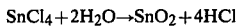

$$SnCl_4 + 2H_2O \rightarrow SnO_2 + 4HCl$$

takes place on the glass. It is convenient at this point to mention that if no special measures were adopted, this reaction would take place very violently with the production of a large amount of stannic oxide (SnO₂) and hydrates of the type SnO₂.nH₂O, at the outlet of the jets 3 to 5 of the nozzle 2, giving rise to the risk of a partial or complete blockage of the jets, with the deposition of these tin oxides on the glass in the form of a white film and not in the form of the desired transparent semi-conducting layer.

With the apparatus described, this risk has been obviated by adding a reducing agent to the two gaseous streams of SnCl₄ and water vapour, this reducing agent being H₂ added to the carrier gas. Hydrogen is in fact a reducing agent with respect to SnCl₄, moderates the hydrolysis, and moreover acts as a catalyst.

The combination reaction between SnCl₄ and H₂O does not take place only in the central region of the nozzle 2, i.e. in the vicinity of the part of this nozzle in which the jets 3, 4 and 5 open out. This reaction takes place when the pump 19 operates so that an area of reduced pressure is created, via the suction ducts 16 and 17 arranged on both sides of the nozzle, in the space between the glass plate V and the lower face of the profiled sections 6a and 6b of the nozzle. As a result, there is formed in this space a gas flow from the central part of the space to the ducts 16 and 17 mentioned above. This flow contains in particular part of the SnCl$_4$ and H$_2$O dispersed in the carrier gas, which have not yet reacted, the HCl vapour already formed, and a certain amount of carrier gas liberated from the reactants that have already reacted. Thus, the reaction between SnO$_2$ and H$_2$O may continue with the residual reactive gases over a certain distance on both sides of the line L of convergence of the jets.

The strength of the suction effect created by the ducts 16 and 17 is chosen so that the reactive gases leaving the nozzle 2 exist in this space only for the time absolutely necessary to produce a deposit of SnO$_2$ on the glass, this deposit being in the form of a transparent layer and not in the form of an accumulation of SnO$_2$ powder. Of course, the suction effect should not be too powerful since otherwise the reactive gases leaving the nozzle would not have sufficient time to reach the surface of the glass. The suction intensity is thus a determining factor as regards the quality and rate of growth of the layer. It should moreover be pointed out that, by virtue of this suction effect, the space between the nozzle and the glass plate, in which the desired reaction takes place, is to some extent isolated from the ambient atmosphere, and thus there is prevented on the one hand any possible penetration into this space of additional moisture that could affect the combination reaction, and on the other hand any escape into this same ambient atmosphere of toxic or harmful vapours, for example HCl or hydrogen, the surrounding air tending to flow into the slits 16a and 16b, and 17a and 17b respectively, having passed between the ducts 16 and 17 respectively, the glass plate V, and the nozzle 2.

The gaseous products withdrawn by means of the pump 19 are passed, as described, to the wash tower 20 so that the residual volatile acids are subjected to percolation and are entrained by water, the resultant acid solution being separated from the washed gases and withdrawn via the pipe 20a.

Under the above operating conditions, the reaction yield was about 70%. The glass was coated over its whole surface with a layer of SnO$_2$ 0.5 to 3 $\mu$m thick, samples of which had a transparency of 60 to 95% and an average conductivity R$_\square$=1 to 10$\Omega$, preferably 2 to 5$\Omega$ in the case of a thickness of 1 to 2 $\mu$m.

In addition, the SnO$_2$ layer thus obtained is found to have a particularly high degree of hardness, greater than that of the glass on which it was deposited. Its strength was very high, both in respect of the most severe mechanical stresses, for example stresses produced by impact, and attack by acids. The glass could in particular be bent into a convex shape having a radius of curvature of 15 cm, after having been heated to between 600° and 700° C., without any deterioration in the SnO$_2$ coating. The glass was also able to be tempered under the usual conditions for normal glass, i.e. cooled from 700° C. at a rate of several °C. per minute. Finally, it should be noted that a glass plate coated with a layer of SnO$_2$ under the conditions and according to the procedures described above, may be cut with a diamond either from the top side or the underside of the plate without chipping or removing the layer.

Using this same apparatus and under operating conditions that differ from those mentioned previously only as regards the drive rate of the plate V, this rate having been increased to 10 meters/minute, a deposit of SnO$_2$ was obtained having a thickness of about 0.1 $\mu$m, an average resistivity of R$_\square$=500$\Omega$, a transparency of almost 100% for visible radiation, and mechanical properties virtually equivalent to those of the deposit obtained by moving the glass plate at a rate of 2 meters/minute.

The direct addition of H$_2$ in order to moderate the violence of the combination reaction between SnCl$_4$ and water vapour is not the only possible measure. According to a variant of the process of the invention, it is possible to employ a carrier gas consisting exclusively of nitrogen and to produce in situ the hydrogen required for the reduction from a water-compatible volatile solvent such as methanol (CH$_3$OH). In such a case the mixing vessel 22 will be utilized, the methanol being entrained by N$_2$ alone, at a flow rate that can be controlled by the valve 40. In this case the carrier gas passing through the evaporator 33 will also be N$_2$. Bearing in mind the relatively high temperature at the outlet of the jets, the methanol may decompose according to the reaction:

$$CH_3OH \rightarrow 2H_2 + CO$$

It may also react with H$_2$O according to the reaction scheme:

$$CH_3OH + H_2O \rightarrow 3H_2 + CO_2$$

In both cases the hydrogen required to control the essential reaction already mentioned:

$$SnCl_4 + 2H_2O \rightarrow SnO_2 + 4HCl$$

is produced in situ.

It is convenient at this point to note that experimental work has not been able to determine which of the above two reactions involving CH$_3$OH is preferred. However, it has been found that under the operating conditions mentioned hereinafter, the introduction of methanol in the deposition process of the desired SnO$_2$ layer effectively enables this process to be controlled in the same manner as when hydrogen mixed with nitrogen is used as carrier gas (FIG. 1). Of course, if desired a mixture of N$_2$/H$_2$ to entrain the water and HF, and methanol diluted with N$_2$ may simultaneously be used, the respective flow rates being regulated by the valves 39 and 40.

In order to obtain with the present pilot plant and in the presence of CH$_3$OH, a glass plate 20 cm wide covered with a transparent layer of SnO$_2$, nitrogen is passed at a flow rate of about 60 liters/hour into the two vessels 21 and 22, the flow rates being regulated by the valves 23a and 24a provided in the flow meters 23 and 24, and N$_2$ is passed at a rate of 60 liters/hour into the evaporator 33, the pump 32 giving an output of 2 moles of H$_2$O/hour. The vessels are heated to suitable temperatures so that the flow rates of the corresponding reactants are 1 mole/hour of SnCl$_4$ and 0.5 mole/hour of CH$_3$OH. The temperature of the nozzle, maintained by circulating oil, was 110° C. as previously, while the glass plate was preheated to a temperature of about 600° C. The glass plate was driven in the direction F at a rate of 2 meters/minute, all the while maintaining a distance of 6 mm from the lower face of the profiled sections 6a and 6b constituting the nozzle.

The SnO$_2$ coating obtained is found to be practically identical in thickness, quality, and mechanical, electrical or physical characteristics to the similar coating obtained as described above but without using methanol.

It should be noted that the invention may perfectly well be carried out without using gaseous HF. In this case, the coating has electrical properties and reflection properties in the IR spectrum which are similar to those of the coatings obtained in the presence of HF. However, in this case it may happen that the glass thus coated has a slightly less clear and less smooth appearance than when the process is carried out in the presence of HF.

When the process is carried out in the presence of this gas, the HF may also be used directly in the form of an aqueous solution in the vessel serving to provide the water vapour for the reaction. 0.1 to 5% by weight of HF in water may be used. Thus, a glass plate 4 mm thick heated to a temperature of about 600° C. was covered with a 0.9 μm thick layer of $SnO_2$ treated with HF by being passed in front of the nozzle at a rate of 2 meters/minute and at a distance of about 6 mm therefrom. The flow rates of the carrier gas (a mixture of 40% $N_2$ and 60% $H_2$) were 60 liters/hour for the $SnCl_4$ and water vapour.

The $SnO_2$ deposit obtained according to the invention in the presence of HF is particularly outstanding. In fact, in the above case its resistivity $R_\square$ was 4Ω, and its reflecting power in the IR spectrum was of the order of 75%.

Moreover, its transparency to visible light was 90%, its surface being particularly smooth and not producing any diffusion of the light (no "milky" areas). The mechanical strength parameters were likewise very high: the glass which was thus coated with $SnO_2$ treated with HF was able to withstand a thermal tempering treatment identical to those to which certain automotive glasses, for example the side windows of cars, are conventionally subjected. It was also possible to bend such a plate hot (temperature about 650° C.) into convex surfaces having radii of curvature of 15 cm without altering the characteristics of the $SnO_2$ deposit treated with HF. Furthermore, a glass plate covered in the described manner could be worked in a conventional manner (cutting, grinding, etc.) without the deposit being damaged.

The $SnO_2$ layer treated with HF had in fact a hardness greater than that of the glass which supported it and it could not be scratched, and in addition its chemical resistance to acids and its resistance to impact and shocks were found to be particularly high. Moreover, such a glass can perfectly withstand tempering involving cooling it from 700° C. at a rate of about 5°–10° C. per second.

It will also be noted that a $SnO_2$ layer treated with HF and deposited on a glass plate under the above conditions may be covered with silver or a silver paint deposited at 600° C., for example in order to form electrical contacts. Such a deposit of silver adheres very well to the surface of the $SnO_2$ deposit with a strength of about 15 kg/cm$^2$.

With the present apparatus and under operating conditions that differ from those indicated above only as regards the rate of movement of the plate V, this rate having been raised to about 10 meters/minute, a $SnO_2$ deposit treated with HF was obtained and had a thickness of about 10 nm, an average conductivity of $R_\square$ of about 200Ω, a transparency of almost 100% in the visible spectrum, a reflecting power in the IR spectrum of 25%, and mechanical properties identical to those obtained with the $SnO_2$ deposit likewise treated with HF by moving the glass plate at a rate of 2 meters/minute.

The use of glass plates of any dimensions covered with a layer of $SnO_2$ treated or not with HF may vary widely depending on their physical, and in particular electrical, behaviour.

Thus, a glass plate covered with a layer of $SnO_2$ obtained according to the invention may be used for example to form insulating glass panes for windows or French windows in houses and dwellings, or windows in boats and trains, on account of its high transparency to visible light, its low emissivity, and is relatively large reflecting power in the IR spectrum. Such a plate has in fact a sufficiently large insulating ability (K=2.3) to reduce by a fairly large extent the amount of thermal radiation capable of passing through this plate. Such glass plates can advantageously replace the conventional double glazing units which are, for the same dimensions, more expensive and more fragile.

It is thus possible to use glass covered with $SnO_2$, treated or not, as heated windows, for example rear windows in cars. Furthermore, as regards the other windows in cars, the glass plates according to the invention may also be used in their place since, on account of their excellent reflectivity in the IR spectrum, they help to improve the efficiency of the air conditioning of the vehicle.

It has also been found that when placed in an atmosphere having a very high degree of humidity, a glass plate carrying a layer of $SnO_2$ will not be covered by a uniform layer of moisture, but rather by a plurality of droplets, which interfere much less with the visibility through the layer as such and the glass plate.

This property is clearly of particular advantage in the case of glass plates intended to form windows, in particular vehicle windows and more especially windscreens and rear windows of cars, buses or lorries.

It should be noted that the glass plates according to the invention may advantageously be employed in horticulture (manufacture of glass panes for greenhouses or cold-frames).

It will also be noted that the process of the present invention may be repeated as desired on a given substrate so as to form a coating consisting of several successive layers, the composition of the latter not necessarily being identical. Thus, an untreated $SnO_2$ layer may if desired be covered with a second layer treated with HF. Similarly, a coating 1 μm thick may be made up of ten successive layers each 100 nm thick, the optical and electrical properties of each layer not necessarily being identical. Preferably each layer is 10 to 500 nm thick.

It is of course obvious that for a given flow rate of the reactants, the thickness of a coating layer depends on the rate of movement of the substrate. Under these conditions the reaction stations may if desired be multiplied by juxtaposing two or more coating devices such as that shown in the drawing. In this way a second layer is superimposed on the first layer before the latter has had time to cool, and so on, which produces a particularly homogeneous overall coating.

Although the preceding description has referred to embodiments of apparatus in which the glass plates to be covered by a layer of $SnO_2$ are always situated at a distance from the nozzle corresponding to that separating this nozzle and the convergence edge of the side walls of the three jets of this nozzle, it should be noted that in practice it is possible to reduce slightly this distance so that the mixture of the reactants leaving these jets strikes the glass, producing a localised, relatively intense turbulence promoting this mixing.

EXAMPLE 1

The Example which follows shows the differences resulting from an application of $SnO_2$ to a glass plate in the presence and in the absence of hydrogen.

The apparatus such as shown in FIG. 1 is employed, without however using the methanol mixer, the valve 40 being closed. The process is carried out under the following operating conditions:

| | |
|---|---|
| Reaction temperature: | 590° C. |
| Operating pressure: | ambient |
| Flow rate from the pump 32: | 10 moles $H_2O$/hour |
| | ≅250 liters/hour of vapour |
| Concentration of HF in $H_2O$: | 2/98 (vol./vol.) |
| Composition of carrier gas: | $H_2/N_2$, 40/60 (vol./vol.) |
| Temperature of the evaporator 33: | 140° C. |
| Flow rate of the gas in the vessel 21 ($SnCl_4$): | 370 liters/hour |
| Temperature of the vessel 21: | 90° C. |
| Flow rate of $SnCl_4$: | 10 moles/hour |
| Rate of passage of the glass V: | 1.2 meters/minute |
| Suction rate of the reaction gases: | 1500 liters/hour |
| Flow rate of the carrier gas in the evaporator 33: | 500 liters/hour. |

A deposit having the following characteristics was thus obtained: thickness 0.6 μm; resistance $R_\square = 20\Omega$; transparency 80%.

The $H_2/N_2$ mixture (carrier gas) was then replaced by nitrogen alone, and a coating having the following characteristics was obtained under the same operating conditions: thickness 0.7 μm; resistance $R_\square = 1000\Omega$; transparency 80%.

With the above operating conditions corresponding approximately to molar proportions of $H_2$, $H_2O$ and $SnCl_4$ of 48 mole %, 26 mole % and 26 mole % respectively, the amounts of reactants and reaction products at equilibrium at 500° and 600° C. and at normal pressure were calculated thermodynamically, and the following values were found:

| Components | With hydrogen | | Without hydrogen* | |
|---|---|---|---|---|
| (mole %) | 500° C. | 600° C. | 500° C. | 600° C. |
| HCl | 43.7 | 43.8 | 64.17 | 67.26 |
| $H_2$ | 40.66 | 40.6 | — | — |
| $H_2O$ | 15.6 | 15.6 | 9.91 | 8.37 |
| $SnCl_2$ (g) | 13.1 | 21.9 | 0.0 | 0.0 |
| $SnCl_2$ (s) | 8.7 | 0.0 | 0.0 | 0.0 |
| $SnCl_4$ | 0.06 | 0.02 | 41.45 | 41.17 |
| $SnO_2$ | 0.0 | 0.0 | 16.1 | 16.8 |

*$H_2O$ 42 mole %, $SnCl_4$ 58 mole % (starting composition)

It is significant that at equilibrium, the reaction when carried out in the presence of $H_2$ does not provide any $SnO_2$ and only a very small amount of $SnCl_4$. It is thus understandable that under the operating conditions (irreversible), a marked reduction of stannic compounds into stannous compounds takes place, with a sharp increase in the conductivity of the deposits.

EXAMPLE 2—DEPOSITION OF A MULTI-LAYER COATING

A coating apparatus comprising a battery of five 1 m nozzles disposed parallel in cascade arrangement was used, each of the nozzles generally conforming to the description given above. The suction channels for evacuating the exhaust gases were arranged so that each nozzle was surrounded by a duct such as shown in the drawing (16, 17). The nozzles are supplied with reactants as described above, the difference being that the first four nozzles are supplied together as regards $H_2O$, while the last nozzle is fed separately with a 5% $HF/H_2O$ solution. The central jets of the five nozzles are fed together with $SnCl_4$.

The process was carried out under the following conditions:

| | |
|---|---|
| Reaction temperature: | 590° C. |
| Pressure: | ambient |
| Flow rate of the water pump (only for the first four nozzles): | 80 moles/hour |
| Flow rate of the pump for water + HF (fifth nozzle): | 20 moles/hour |
| Composition of the $H_2O$/HF mixture: | 98/2 (mole/mole) |
| Composition of the carrier gas (common to the five nozzles): | $H_2/N_2$ 50/50 (vol./vol.) |
| Overall flow rate of the carrier gas for water in the first four nozzles: | 7000 liters/hour |
| Flow rate of the carrier gas for water + HF: | 1800 liters/hour |
| Temperature of the evaporators: | 140° C. |
| Flow rate of the carrier gas in the $SnCl_4$ vessel: | 3500 liters/hour |
| Temperature of the $SnCl_4$ vessel: | 90° C. |
| Flow rate of $SnCl_4$: | 50 moles/hour |
| Overall suction rate: | 15 m³/hour |
| Rate of movement of the glass: | 10 meters/minute |

A coating comprising five superimposed layers each 0.1 μm thick, only the last being treated with fluorine, was thus obtained. This coating had the following properties: $R_\square = 20\Omega$; IR reflectivity 55%; transparency 85%.

We claim:

1. A process for forming on a mineral substrate an adherent coating of stannic oxide having a resistivity below $10^{-2}\Omega$ cm, comprising heating the substrate to at least 500° C. and reacting on the heated substrate's surface a volatile tin compound and water vapor diluted in a carrier gas containing at least 30% hydrogen, thereby depositing said coating on said substrate.

2. A process as claimed in claim 1 wherein the substrate is a laminar article and wherein the coating is deposited to a thickness of 1 to 3 μm and has a surface resistance of 1–10Ω, a transparency of 60–95% and an IR reflectivity not less than 50%.

3. A process according to claim 1 in which hydrogen fluoride gas is added to the reaction mixture to reduce stray dispersion and scattering of light in the stannic oxide coating formed.

4. A process according to claim 3 in which the hydrogen fluoride gas is provided in admixture with water in an amount of 0.1 to 5% by weight.

5. A process according to claim 1 in which after formation of a first layer of stannic oxide, the coating deposition is repeated at least one further time to form a coating comprising at least two superimposed layers of stannic oxide.

6. A process according to claim 5 in which the thickness of each of the individual layers forming the coating is 10 to 500 μm.

7. A process for forming on a mineral substrate an adherent coating of stannic oxide having a resistivity below $10^{-2}\Omega$ cm, comprising heating the substrate to at least 500° C. and reacting on the heated substrate's surface a volatile tin compound and water vapor diluted in a carrier gas, which carrier gas contains a compound capable of thermally decomposing in the presence of the heated substrate to provide at least 30% hydrogen relative to said carrier gas, thereby depositing said coating on said substrate.

8. The process of claim 7, wherein the compound providing the hydrogen is methanol.

* * * * *

UNITED STATES PATENT AND TRADEMARK OFFICE
CERTIFICATE OF CORRECTION

PATENT NO. : 4,325,987
DATED : April 20, 1982
INVENTOR(S) : Reinhard Kalbskopf et al.

It is certified that error appears in the above-identified patent and that said Letters Patent are hereby corrected as shown below:

Column 1, line 40, change "at least" to --below--.

Column 7, line 48, change "conductivity" to --resistance--.

Column 8, line 4, change "resistivity" to --resistance--.

Column 9, line 27, change "resistivity" to --resistance--

Column 9, line 66, change "conductivity" to --resistance--.

Signed and Sealed this

Seventeenth Day of August 1982

[SEAL]

Attest:

GERALD J. MOSSINGHOFF

*Attesting Officer*    *Commissioner of Patents and Trademarks*